US007405413B2

(12) United States Patent
Hergenhan et al.

(10) Patent No.: US 7,405,413 B2
(45) Date of Patent: Jul. 29, 2008

(54) ARRANGEMENT FOR PROVIDING TARGET MATERIAL FOR THE GENERATION OF SHORT-WAVELENGTH ELECTROMAGNETIC RADIATION

(75) Inventors: Guido Hergenhan, Jena (DE); Christian Ziener, Jena (DE); Kai Gaebel, Jena (DE)

(73) Assignee: XTREME technologies GmbH, Jena (DE)

( * ) Notice: Subject to any disclaimer, the term of this patent is extended or adjusted under 35 U.S.C. 154(b) by 377 days.

(21) Appl. No.: 11/182,363

(22) Filed: Jul. 15, 2005

(65) Prior Publication Data

US 2006/0024216 A1 Feb. 2, 2006

(30) Foreign Application Priority Data

Jul. 30, 2004 (DE) ....................... 10 2004 037 521

(51) Int. Cl.
*G03F 7/20* (2006.01)

(52) U.S. Cl. ............................. 250/492.2; 250/492.22; 355/67; 355/77

(58) Field of Classification Search ............. 250/504 R, 250/288, 388.5; 378/119
See application file for complete search history.

(56) References Cited

U.S. PATENT DOCUMENTS

| | | | | |
|---|---|---|---|---|
| 5,577,092 | A | 11/1996 | Kublak et al. | |
| 5,973,999 | A * | 10/1999 | Naff et al. | 367/139 |
| 6,324,256 | B1 | 11/2001 | McGregor et al. | |
| 6,756,592 | B1 * | 6/2004 | Smith et al. | 250/338.5 |
| 6,987,275 | B2 * | 1/2006 | Bakker et al. | 250/492.2 |
| 7,109,480 | B2 * | 9/2006 | Vestal et al. | 250/288 |

(Continued)

FOREIGN PATENT DOCUMENTS

DE 10 2004 005 241 8/2005

(Continued)

OTHER PUBLICATIONS

Proceedings of SPIE, vol. 4688 (2002) pp. 619-625 "Laser Plasma Radiation Sources based on a Laser-Irradiated Gas Puff Target for X-Ray and EUV Lithography Technologies" Henryk Fiedorowiez, et al.

*Primary Examiner*—Nikita Wells
*Assistant Examiner*—Johnnie L Smith
(74) *Attorney, Agent, or Firm*—Reed Smith LLP

(57) ABSTRACT

The invention is directed to an arrangement for providing target material for the generation of short-wavelength electromagnetic radiation, in particular EUV radiation. It is the object of the invention to find a novel possibility for providing target material for the generation of short-wavelength radiation based on an energy beam induced plasma which makes it possible to supply a reproducible successive flow of mass-limited targets in the interaction chamber in such a way that only the amount of target material needed for efficient generation of radiation achieves plasma generation. This object is met, according to the invention, in that the target generator opens into a selection chamber which precedes the interaction chamber and which has, along the target path, an outlet opening into the interaction chamber and in which a target selector is arranged. The target selector has elements for eliminating individual targets needed for the regular target sequence of the target generator, so that only the individual targets needed for efficient plasma generation and radiation generation corresponding to the pulse frequency of the energy beam are admitted to the interaction point.

24 Claims, 5 Drawing Sheets

U.S. PATENT DOCUMENTS 7,161,163 B2 * 1/2007 Gaebel et al. ........... 250/504 R
2005/0169429 A1 * 8/2005 Gaebel et al. ............... 378/119
2006/0017026 A1 * 1/2006 Hergenhan et al. ...... 250/504 R

FOREIGN PATENT DOCUMENTS

EP 0 186 491 9/1992
EP 0 895 706 6/2003
WO WO 01/30122 4/2001
WO WO 2004/084592 9/2004

* cited by examiner

ARRANGEMENT FOR PROVIDING TARGET MATERIAL FOR THE GENERATION OF SHORT-WAVELENGTH ELECTROMAGNETIC RADIATION

CROSS-REFERENCE TO RELATED APPLICATIONS

This application claims priority of German Application No. 10 2004 037 521.6, filed Jul. 30, 2004, the complete disclosure of which is hereby incorporated by reference.

BACKGROUND OF THE INVENTION a) Field of the Invention

The invention is directed to an arrangement for providing target material for the generation of short-wavelength electromagnetic radiation, in particular EUV radiation, based on an energy beam induced plasma. It is preferably applied in light sources for projection lithography in semiconductor chip fabrication.

b) Description of the Related Art

Reproducible mass-limited targets for pulsed energy input for plasma generation have gained acceptance, above all in radiation sources for projection lithography, because they minimize unwanted particle emission (debris) compared to other types of targets. An ideal mass-limited target is characterized in that the particle number at the interaction point of the energy beam is limited to the particles used for generating radiation.

Excess target material that is vaporized or sublimated or which, although ionized, is not excited by the energy beam to a sufficient degree for the desired radiation emission (marginal area or immediate surroundings of the interaction point) causes not only increased emission of debris but also an unwanted gas atmosphere in the interaction chamber which in turn contributes considerably to an absorption of the short-wavelength radiation generated from the plasma.

There are a number of embodiment forms of mass-limited targets known from the prior art. These are listed in the following along with their characteristic disadvantages:

Continuous liquid jet, possibly also frozen (solid consistency) (EP 0 895 706 B1)

- Mass limiting can be realized only to a limited extent because of the large size of the target in one linear dimension, resulting in increased debris and an unwanted gas burden in the vacuum chamber.
- The shock wave proceeding from the plasma expansion in the target jet in the direction of the target nozzle leads to a certain destruction of the target flow and, therefore, to a limiting of the pulse repetition rate of the laser excitation.

Clusters (U.S. Pat. No. 5,577,092), gas puffs (Fiedorowicz et al., SPIE Proceedings, Vol. 4688, 619) and aerosols (WO 01/30122 A1; U.S. Pat. No. 6,324,256 B1)

- lead to severe nozzle erosion with short distances between the interaction point and the target nozzle and, at large distances from the nozzle (due to dramatically decreasing average density of the target), to a low efficiency of the radiation emission of the plasma.

Continuous flow of individual droplets (EP 0 186 491 B1)

- requires precise synchronization with the excitation laser,
- cold target material in the vicinity of the plasma (less than with the target jet, but still present) is vaporized and leads to absorbent gas atmosphere and increased debris.

All of the so-called mass-limited targets mentioned above have in common that there is more target material in the interaction chamber than is needed for generating the emitting plasma in spite of limiting the diameter of the target flow. With a continuous flow of droplets, for example, only about every hundredth drop is struck by the laser pulse. Apart from increased generation of debris, this leads to excess target material in the interaction chamber which causes an increased gas burden (particularly when xenon is used as target) and, therefore, an increased pressure in the interaction chamber. The increased gas burden leads in turn to an unwanted increase in the absorption of radiation emitted by the plasma. Further, the unused target material leads to increased material consumption and accordingly raises costs unnecessarily.

OBJECT AND SUMMARY OF THE INVENTION

It is the object of the invention to find a novel possibility for providing target material for the generation of short-wavelength radiation based on an energy beam induced plasma which makes it possible to supply a reproducible successive flow of mass-limited targets in the interaction chamber in such a way that only the amount of target material needed for efficient generation of radiation interacts with the energy beam and, therefore, debris generation and the gas burden in the interaction chamber are minimized.

In an arrangement for providing target material for the generation of short-wavelength electromagnetic radiation, in particular EUV radiation, in which a target generator for generating a regular succession of individual targets is arranged so as to open into an interaction chamber, wherein the generated target sequence advances along a target path, and an energy beam for generating a plasma emitting the desired radiation is directed to an interaction point on the target path, the above-stated object is met, according to the invention, in that the interaction chamber is preceded by a selection chamber into which the target generator opens and which has, along the target path, an outlet opening into the interaction chamber, and in that a target selector is arranged in the selection chamber, which target selector has means for eliminating individual targets from the regular target sequence of the target generator, so that only the individual targets necessary for efficient plasma generation corresponding to a given pulse frequency of the energy beam are admitted to the interaction point in the interaction chamber.

The target selector advantageously has a rotating chopper wheel in which the quantity of admitted individual targets and eliminated individual targets can be adjusted by means of a mark-to-space or duty cycle ratio of apertures to closed areas of the chopper wheel which cyclically or periodically cross the target path.

The target selector preferably comprises at least two chopper wheels that are arranged one after the other along the target path. The quantity of individual targets that are admitted and eliminated is adjusted by the duty cycle ratios of apertures to closed areas of the individual chopper wheels and by the phase position of the apertures of the chopper wheels with respect to one another.

The chopper wheels can be arranged on a common axis with fixed phase position relative to one another. However, they can also have separate, spatially separated axes or can be arranged coaxially on a solid shaft and at least one hollow shaft in order to make the phase position and the spacing of the chopper wheels variably adjustable.

In a variant with two chopper wheels, the first chopper wheel advisably has a duty cycle ratio of apertures to closed areas such that a column of individual targets from the target sequence provided by the target generator is admitted to the second chopper wheel.

The spacing of the chopper wheels along the target path is advisably adjusted in such a way that only one individual target from the target column entering through the first chopper wheel can pass through the second chopper wheel into the interaction chamber.

Because of the vaporization or sublimation of target material, particularly in target materials with a high vapor pressure (>25 kPa) under process conditions (e.g., xenon), it is advantageous when the spacing of the chopper wheels along the target path is adjusted in such a way that at least two individual targets following one another in close succession from the target column entering through the first chopper wheel are admitted through the second chopper wheel, wherein at least a first target is a sacrifice target for forming a vaporization shield for at least one subsequent main target.

In another advisable constructional variant, the target selector has an open hollow cylinder which is arranged so as to be rotatable around its cylinder axis disposed orthogonal to the target path such that it is pierced by the target path at two points, and the quantity of admitted individual targets and eliminated individual targets can be adjusted by a duty cycle ratio of apertures to closed areas of the cylinder jacket and by the spacing of the cylinder axis relative to the target path.

The hollow cylinder advantageously has a duty cycle ratio of apertures to closed areas such that a column comprising a plurality of individual targets from the target sequence provided by the target generator is allowed to enter the hollow cylinder.

The spacing of the cylinder axis of the hollow cylinder relative to the target path can preferably be adjusted in such a way that only one individual target from the target column entering the hollow cylinder exits from the hollow cylinder into the interaction chamber.

Particularly for target materials with high vapor pressure which were mentioned above, the distance of the cylinder axis of the hollow cylinder from the target path is adjusted in such a way that at least two successive individual targets from the target column entering the hollow cylinder exit from the hollow cylinder into the interaction chamber, wherein at least a first target is a sacrifice target for forming a vaporization shield for at least one subsequent main target.

In another advantageous embodiment, the target selector has a deflecting unit based on a force field for deflecting a quantity of individual targets from their normal target path, wherein the force field is switchable in a pulsed manner so that only a determined number of individual targets generated by the target generator arrive in the interaction chamber through the outlet opening of the selection chamber and the wall next to the outlet opening is provided for intercepting the rest of the targets. The deflecting unit can be arranged in such a way that the deflected targets are caught in the selection chamber at the wall next to the outlet opening or in such a way that only the deflected targets reach the interaction point in the interaction chamber through the outlet opening of the selection chamber.

The target selector preferably comprises a ring electrode and a deflecting unit based on an electric field (similar to an oscillograph). However, the deflecting unit can also advisably be based on a magnetic field without changing the manner of operation described above.

The selection chamber advisably has a pump for differential pumping out of target material that is eliminated by the target selector. In addition, the selection chamber can have a heatable surface for faster vaporization of target materials with a lower vapor pressure under process conditions(<25 kPa, e.g., tin compounds, particularly tin(IV) chloride or tin (II) chloride in alcoholic solution). A surface of this kind is advisably a wall of the selection chamber in the rotating direction of a chopper blade or the wall with the outlet opening or the surface of a chopper wheel.

Regardless of the type of means for target selection, it is advantageous for the adjustment of the target selector when it passes exactly one individual target into the interaction chamber from the target sequence provided by the target generator in order to bring this individual target, as mass-limited target, into interaction with the energy beam. However, it is preferable for the above-mentioned target materials with high vapor pressure under process conditions that the target selector is adjusted in such a way that it passes at least two successive individual targets of the target sequence provided by the target generator, wherein at least a first target of a target column of this kind is a sacrifice target for forming a vaporization shield for at least one subsequent main target.

The basic idea of the invention proceeds from the consideration that the desired short-wavelength electromagnetic radiation, particularly EUV radiation, that is radiated from an energy beam induced plasma is, according to the prior art, already partially absorbed again in the interaction chamber by vaporized target material. On the other hand, inefficiently excited target material results in increased debris generation. Therefore, the objective must be to select exactly as much target material from a reproducibly generated series of individual targets as is needed for efficient generation of short-wavelength electromagnetic radiation in the desired wavelength range. According to the invention, this is accomplished by means of adjustable selection of a conventionally provided individual target flow by eliminating excess individual targets before they enter the interaction chamber. Mechanical rotary elements with apertures or deflecting units based on electromagnetic fields for selectively passing individual targets in desired timed sequences are suitable for the required pulse frequencies of semiconductor lithography according to the invention.

The solution according to the invention makes it possible to provide reproducible successive flows of mass-limited targets in the interaction chamber for the generation of short-wavelength electromagnetic radiation based on an energy beam induced plasma in such a way that only the amount of targets needed for an efficient generation of radiation achieves interaction with the energy beam and, therefore, debris generation and the gas burden in the interaction chamber are minimized. Further, the consumption of target material is reduced and leads to a reduction in costs.

The invention will be described more fully in the following with reference to embodiment examples.

DESCRIPTION OF THE PREFERRED EMBODIMENTS

Figure 1:
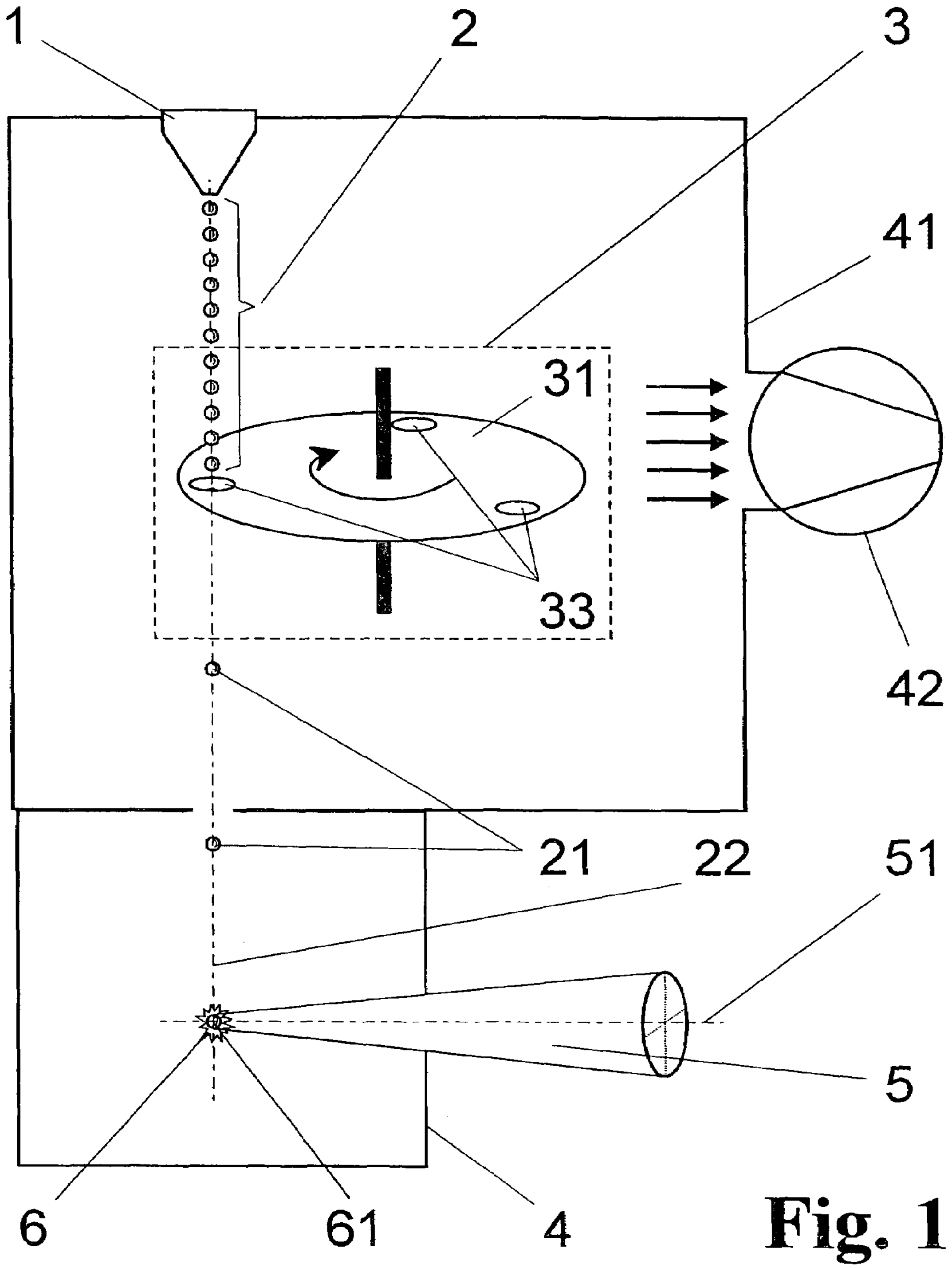
FIG. 1 shows a schematic view of the arrangement according to the invention with a target selector for providing individual targets for interaction with an energy beam in an interaction chamber, wherein the selection of individual targets from the target flow is carried out by means of a chopper wheel on which a suitable geometric ratio of apertures and closed areas is realized along a circular line.

As is shown in FIG. 1, the arrangement for the generation of defined mass-limited targets for energy beam induced generation of short-wavelength electromagnetic radiation (preferably EUV radiation) basically comprises a target generator 1 which generates a discontinuous target flow 2 as a regular series 23 of individual targets 21 (droplets or pellets, i.e., solid target material, e.g., generated by frozen or solidified liquid droplets), and a target selector 3 which is arranged in a selection chamber 41 arranged in front of the interaction chamber 4, wherein a plasma 6 is generated in the interaction chamber 4 by an energy beam 5 at an interaction point 61 given by the intersection of the target path 22 with the axis of an energy beam 5.

The regular, discontinuous target flow which enters the selection chamber 41 as a close, regular target sequence 23 provided by the target generator 1 undergoes a cyclic or periodic elimination of a certain quantity of individual targets 21 of the target sequence 23 by means of the target selector 3. An individual target 21—as is shown in FIG. 1—or a defined column 24 (FIG. 4) can be passed. The selected individual targets 21 pass an outlet opening 43 of the selection chamber 41 which, at the same time, is an inlet opening into the interaction chamber 4. They then arrive at the interaction point 61 with the energy beam 5 on their target path 22.

In principle, the target selector 3 can periodically pass only an integral number of individual targets of the target flow 2 comprising individual targets 21 that are regularly delivered by the target generator 1 and laterally deflects the rest of the intervening target sequence 23. In the basic variant shown in FIG. 1, the individual targets 21 admitted by the target selector 3 are spaced so as to be precisely adapted to the pulse sequence of the energy beam 5.

FIG. 1 shows a particularly simple realization illustrating the principle of target selection in which a chopper wheel 31 is used as target selector 3. The resulting duty cycle ratio of the individual targets 21 at the outlet opening 43 of the selection chamber 41 is given solely by the geometric ratio of the apertures 33 of the chopper wheel 31 to the closed areas between the apertures 33.

The individual targets 21 provided in close succession from the target generator 1 initially impinge on the chopper wheel 31 which periodically allows a few individual targets 21 to pass depending on the number of revolutions and the aperture ratio (ratio of apertures 33 to closed areas in tangential direction between the apertures 33 of the preferably circular plate).

In this case, without limiting generality, only one individual drop target should be selected from a target sequence 23 of seven drops to collide with the energy beam 5 in the interaction chamber 4. The trajectory 22 of the subsequent individual targets 21 (six individual targets are shown schematically for the sake of simplicity, but in reality there are 10 to 100 drops) is interrupted since they rebound on a closed area of the chopper wheel 31.

At the point of interaction 61 of the individual target 21 and the energy beam 5 (which can preferably be a laser beam 52 or an electron beam), the frequency at which targets are prepared corresponds to the product of the rotating frequency and the quantity of apertures 33 which are arranged peripherally in the chopper wheel 31 (and which, aside from the bore holes shown schematically, can also have the shape of rectangles, trapezoids, slots or notches).

The design of the target selector 3 with one chopper wheel 31 is based on the following boundary conditions: The desired repetition frequency of a laser used as source for the energy beam 5 is, e.g., 10 kHz. A typical repetition rate of the close target sequence 23 of regularly reproduced individual droplets (generated, e.g., from a nozzle of 20 μm) is on the order of 1 MHz. Accordingly, only every hundredth droplet is necessary for the interaction with the laser beam 52 (shown only in FIG. 4).

A technical solution that can satisfy this requirement for droplet isolation is a chopper wheel 31 with a duty cycle ratio of 1:99, as is shown schematically in FIG. 1. Assuming a size of the apertures 33 of 100 μm for an individual target 21 to be admitted, the period length is 10 mm. Consequently, for a chopper wheel 31 in which the apertures are arranged on a radius of 2.5 cm, about fifteen periods can be accommodated. The chopper wheel 31 must then run at a rotating frequency of 666 Hz. This corresponds to a speed of 40,000 RPM. It is technically difficult to achieve such rotational speeds and, therefore, the embodiment form shown in FIG. 1 is only applicable for larger droplet diameters which are generally generated with a lower frequency (20 to 100 kHz).

The individual targets 21 of the close target sequence 23 of the target flow 2 that do not pass the target selector 3 are deflected by the chopper wheel 31 in the selection chamber 41. They vaporize or sublimate at the surfaces in the selection chamber 41 (primarily at the surface of the chopper wheel 31 itself). The resulting target gas is pumped off differentially by a pump 41 and can be recovered and reused.

If required for the target material (e.g., with a low vapor pressure <25 kPa), the chopper wheel 31 must be additionally heated so that the large number of eliminated targets of the target sequence 23 is sufficiently vaporized or sublimated in order to pump out the target gas by means of the pump 42. With most current target materials (preferably xenon), however, the vapor pressure is already higher than the pressure inside the selection chamber 41 under process conditions.

There is a range of technical embodiment forms for the construction of the target generator 1, vacuum pumps, of which only the pump 42 of the selection chamber 41 is shown, and for the target selector 3. For example, aside from the vibration-controlled droplet generator, techniques such as the principle of the high-pressure liquid jet (continuous jet) known from ink printing technology, an embodiment variant of which is described with reference to FIG. 7, can be used for the target generator 1.

Depending upon requirements given by the target material employed, useful embodiment forms for the pump 42 (as well as for the vacuum pumps of the interaction chamber 4) are cryopumps or scroll pumps.

Some special possibilities for realizing the target selector 3 will now be described more fully with reference to the following descriptions of the drawings (FIGS. 2 to 7).

In the embodiment forms shown in FIGS. 2 to 5, the target selection is realized by means of two chopper wheels 31 and 32 which are arranged at a certain distance. Regardless of the desired target frequency at the interaction point 61, each chopper wheel 31 and 32 can have a duty cycle ratio of 1:1. For example, about 750 apertures 33 can be arranged on the edge of every chopper wheel 31 or 32 with a radius of 2.5 cm and a period length of 200 μm. For the desired repetition frequency of 10 kHz of the laser beam 52 (only shown in FIGS. 4 and 7), the two chopper wheels 31 and 32 must rotate at a frequency of about 13.3 Hz or 800 RPM. A solution of this kind can be controlled easily in technical respects considering that the entire arrangement must be operated under vacuum.

The frequency of a target column 24 is determined from the product of the speed and quantity of periods of the first chopper wheel 31 and the quantity of passed individual targets 21 per target column 24 is determined from the relative position (phase position) of the second chopper wheel 32 and the target frequency of the regular close target sequence 23.

Figure 2:
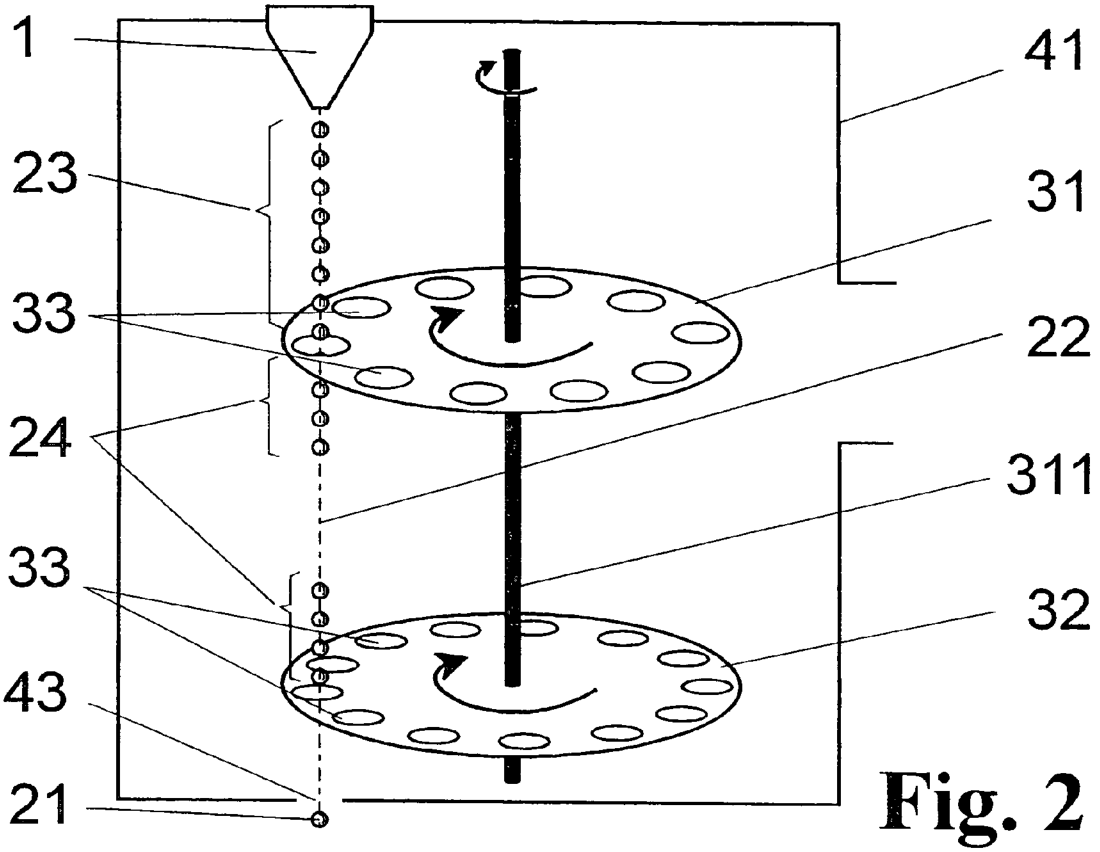
FIG. 2 shows an embodiment of the invention for the selection of individual targets with two chopper wheels on a common axis, wherein initially defined columns of individual targets are generated for further selection.

With the target selector 3 shown in FIG. 2, the individual targets 21 initially strike a first chopper wheel 31 which is rotatable around an axis 311 and which can pass cyclically defined columns 24 of individual targets 21 (four individual targets 21 are shown schematically in this case without limiting generality) depending on the rate of rotation and the duty cycle ratio (of apertures 33 to the closed areas located in between). The trajectory 22 of the subsequent individual targets 21 (also shown schematically as four) is interrupted because they collide with a closed area of the chopper wheel 31.

A second chopper wheel 32 is located on the same axis 34 at a defined distance and a determined phase position relative to the chopper wheel 31 so that the second chopper wheel 32 can again pass only a predetermined quantity of individual targets 21 (in this case only one individual target 21) of the column 24 of individual targets 21 admitted by the first chopper wheel 31.

The target sequences 23 or columns 24 that do not pass the two chopper wheels 31 and 32 vaporize and sublimate at warm surfaces in the selection chamber 41. The resulting gas is pumped out through a pump 42 and can possibly be recycled.

Figure 3:
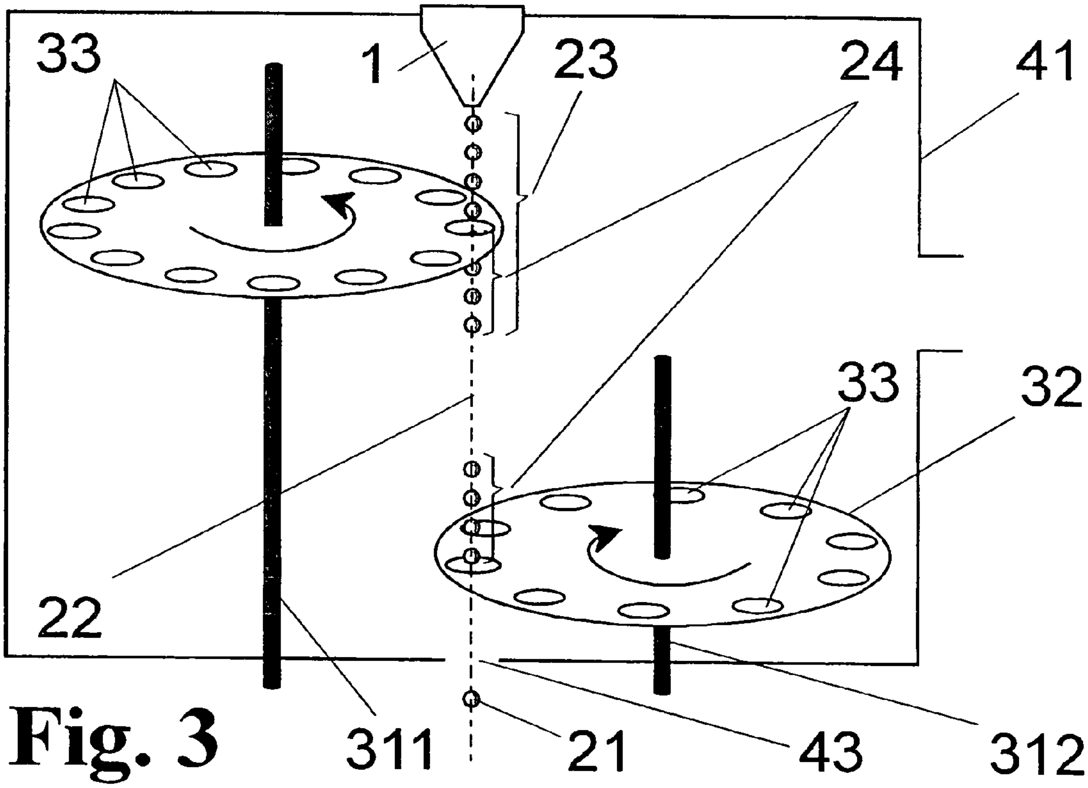
FIG. 3 shows another embodiment example of the invention with two chopper wheels on separate axes rotating in opposite directions.

FIG. 3 shows an embodiment form of a target selector 3 in which the second chopper wheel 32 is located on an axis 312 which is separate from axis 311 of chopper wheel 31, these axes extending parallel to one another but so as to be spatially separated. The respective phase position between the chopper wheels 31 and 32 can accordingly be adjusted differently (e.g., individual target 21 or double-target comprising sacrifice target 25 and main target 27) for different speeds (target frequencies) and quantity of individual targets 21 still to be let in through the second chopper wheel 32 after the selection of a defined column 24 carried out by the first chopper wheel 31. Also, it may be advantageous that the chopper wheels 31 and 32 move in opposite directions (as is shown in FIG. 3) for target materials with a low vapor pressure (<25 kPa) so that the target material that does not vaporize immediately is flung against a vaporization surface (not shown) inside the selection chamber 41.

Figure 4:
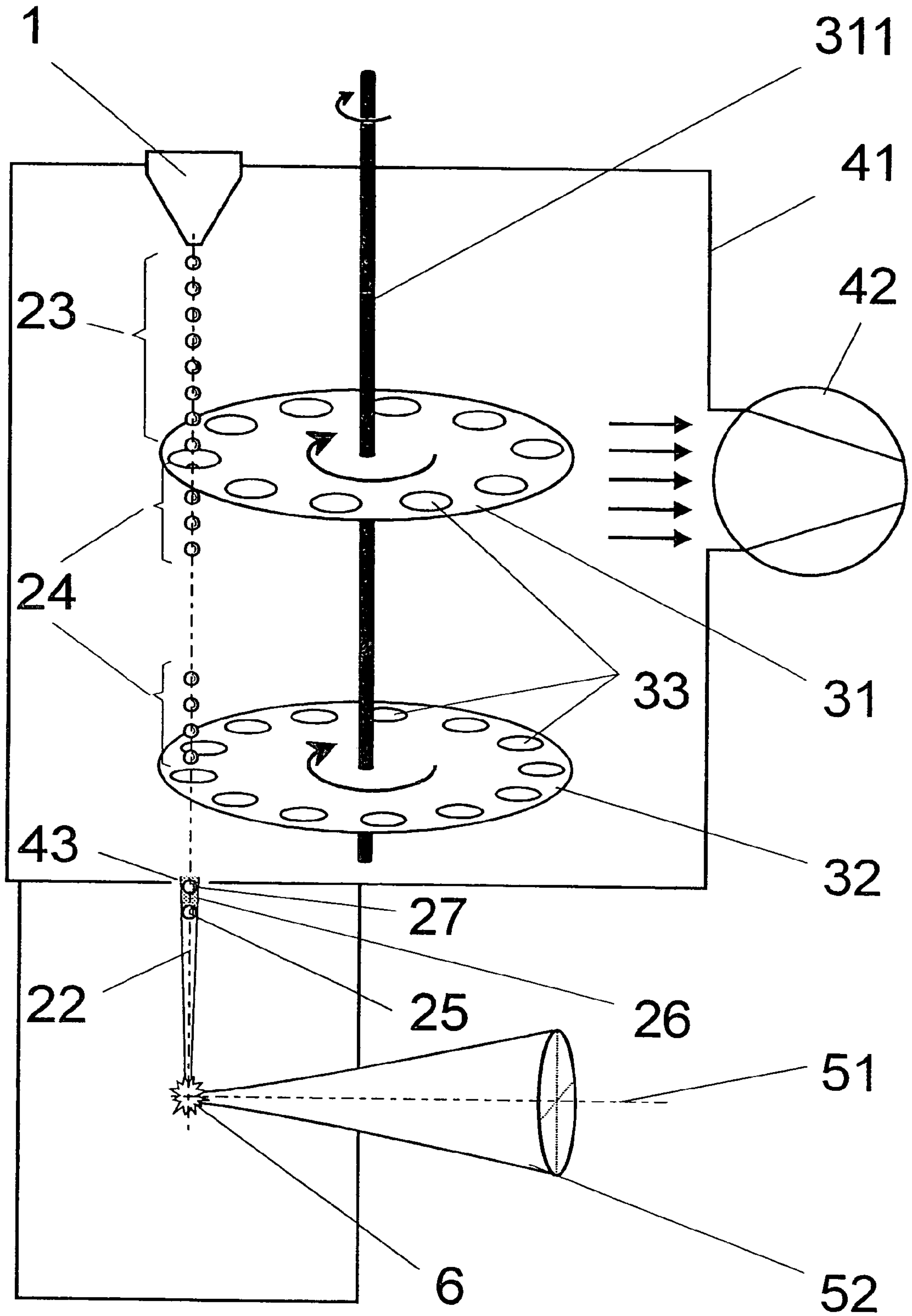
FIG. 4 shows a variant of the invention that is modified from FIG. 2, wherein two successive individual targets are provided for generating a radiation shield for one of the two individual targets.

The functioning of the construction according to FIG. 4 substantially corresponds to that shown in FIG. 2. However, the ratios of flight velocity of the individual targets 21, distance and phase position of the chopper wheels 31 and 32 are adjusted in such a way that every two closely successive individual targets 21 reach the interaction chamber 4.

The target closer to the plasma 6 has the function of a sacrifice target 25 for forming a vaporization shield 26 for the subsequent main target 27. Accordingly, the sacrifice target 25 is completely or almost vaporized or sublimated corresponding to the absorbed radiation output from the plasma 6. The subsequent main target 27 for interaction with the laser beam 52 arrives without considerable loss of mass at the interaction point 61 which is given by the intersection of the axis 51 of the laser beam 52 with the target path 22 and in which the plasma 6 emitting the desired radiation (e.g., EUV) is generated as a result of the input of energy into the main target 27.

Figure 5:
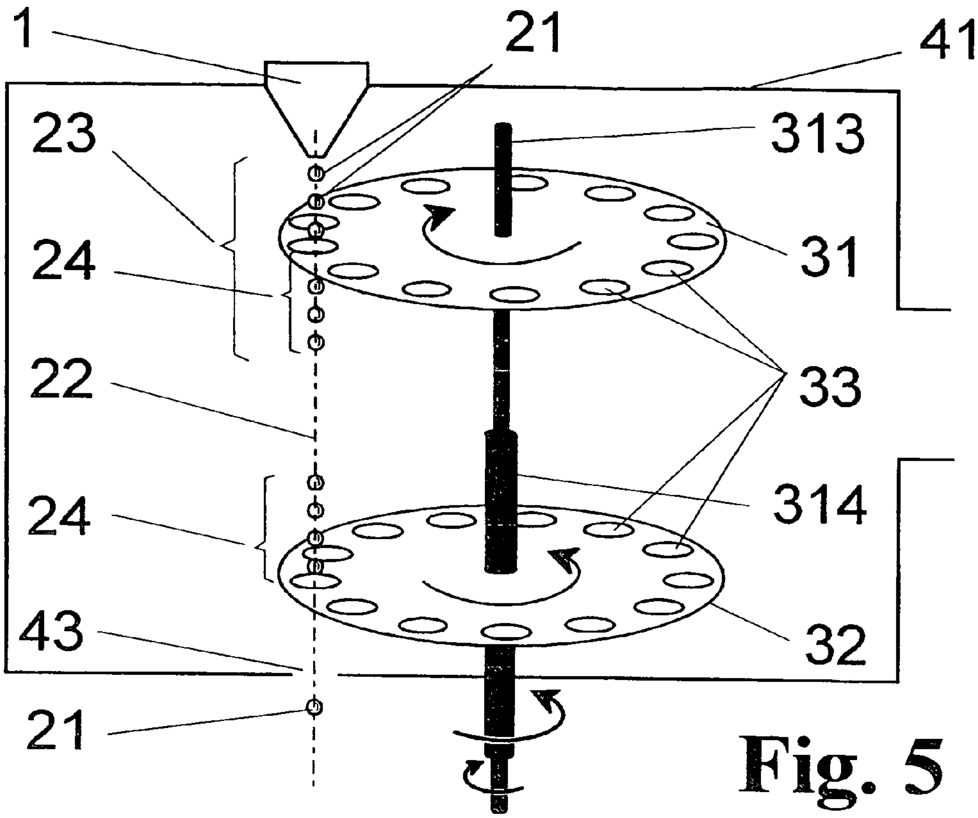
FIG. 5 shows an embodiment form with two separately rotatable chopper wheels in which, in contrast to FIG. 3, the chopper wheels are arranged coaxially on a solid shaft and a hollow shaft.

The functioning of the target selector 3 shown in FIG. 5 corresponds in essence to the solution disclosed with reference to FIG. 3. The only difference is that collinear axes formed as a solid shaft 313 and hollow shaft 314 are used for the chopper wheels 31 and 32. Accordingly, different speeds and—if required—a different rotating direction are possible with the same center of rotation.

Figure 6:
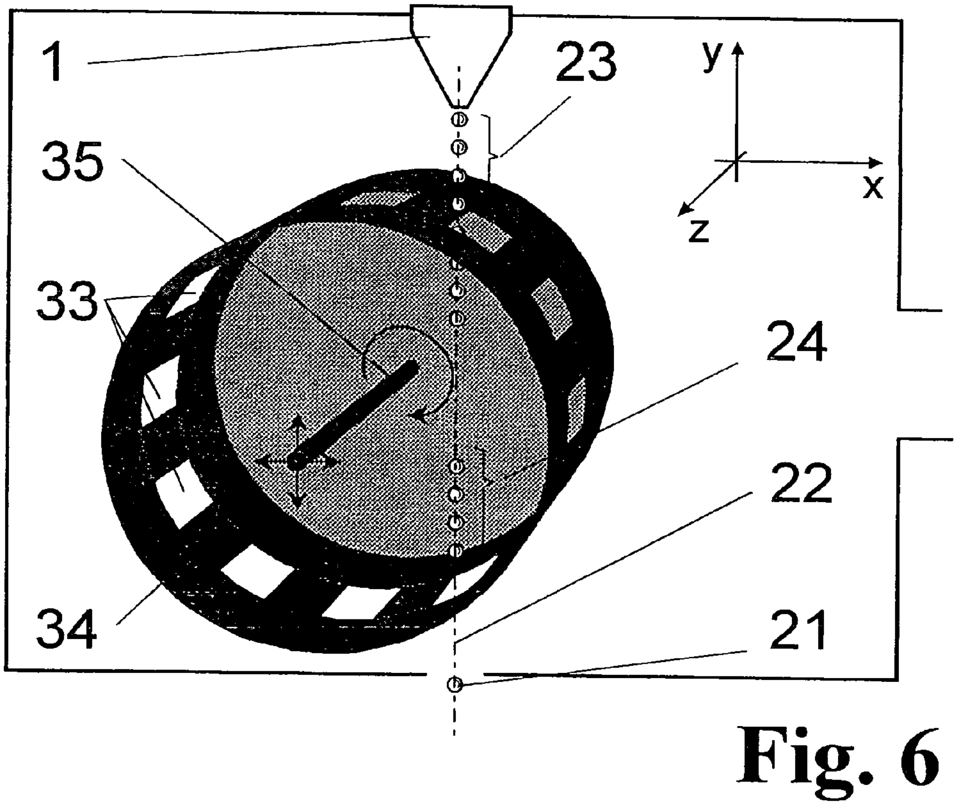
FIG. 6 shows an embodiment example with a chopper wheel that is constructed as a hollow cylinder and which has an axis oriented orthogonal to the target path, wherein another isolation of targets is carried out analogous to FIG. 2, 4 or 5 after a first preselection as a result of the target path piercing the hollow cylinder twice.

FIG. 6 shows an appreciably modified embodiment example of a target selector 3. This example shows an open hollow cylinder 34 which rotates around its cylinder axis 35 orthogonal to the target path 22.

At the upper intersection of the hollow cylinder 34 and the target path 22, target columns 24 are generated corresponding to the angular velocity and the duty cycle ratio of the apertures 33 of the hollow cylinder 34. The quantity of individual targets 21 of the column 24 entering the interior of the hollow cylinder 34 is given by the product of the rotational speed of the hollow cylinder 34 and the quantity of apertures 33 in the outer surface.

At the lower intersection, a portion of the target column 24 is again obstructed in its trajectory 22 in that it is deflected by a closed area of the hollow cylinder 34. The quantity of individual targets 21 that pass the target selector 3 designed in this way per time unit is adjustable by adjusting the cylinder axis 35 in x-direction. The initial phase can be adjusted by a y-displacement of the cylinder axis 35.

Figure 7:
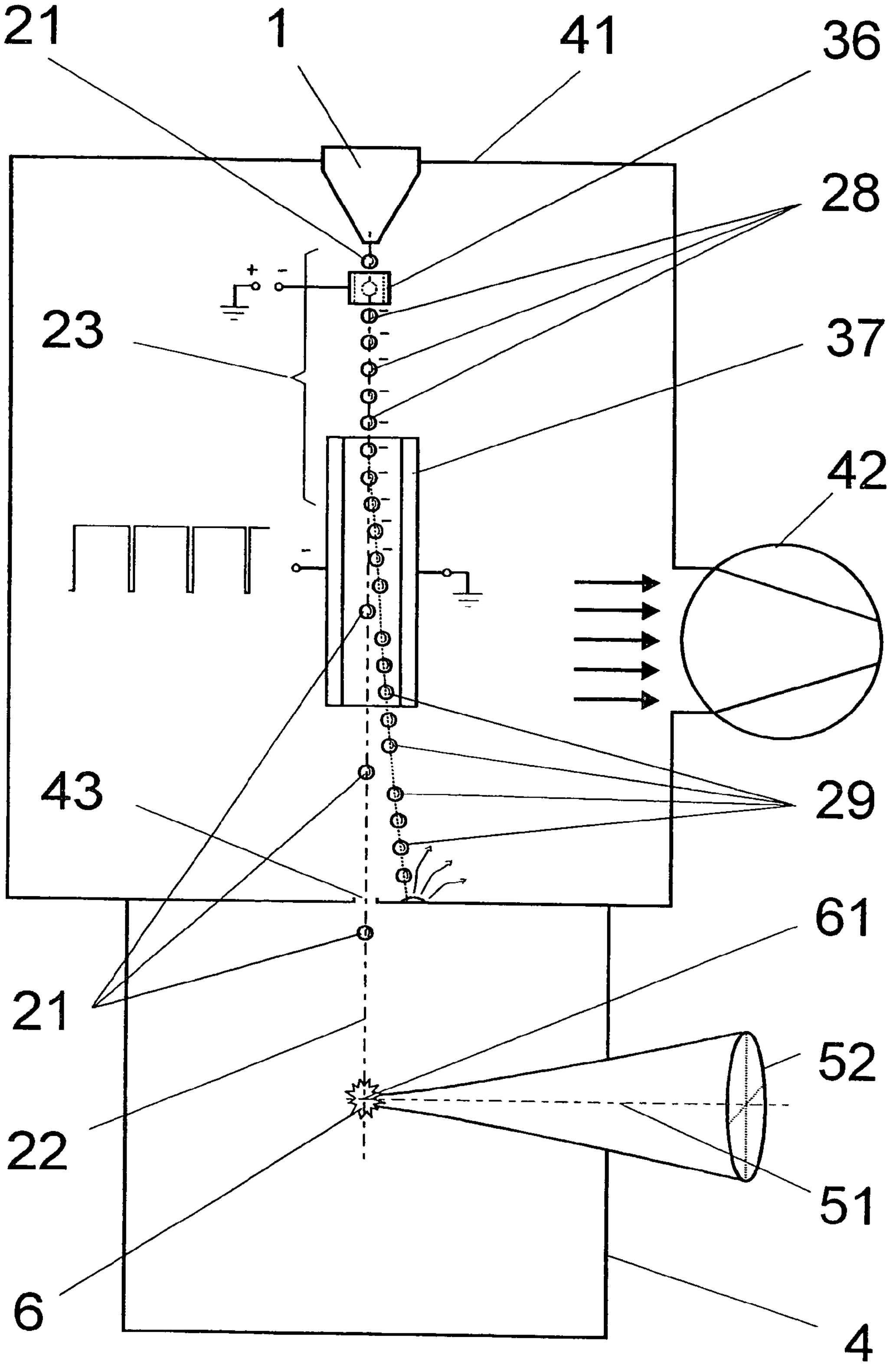
FIG. 7 shows a design variant with a target selector based on an electrical field for deflecting targets from the normal target path and intercepting the surplus individual targets at the selection chamber wall next to the outlet opening.

FIG. 7 shows a second basic variant of the target selector 3 which diverges from the mechanical selection of excess individual targets 21 from the regular target sequence 23 of the target flow 23.

As in the previous examples, the target flow 2 from the target generator 1 is generated in a regular target sequence 23 from individual targets 21. In this case, however, it is assumed that a heterodyned high-pressure target generator 1 is used which can eject up to one million drops per second. Depending on the nozzle geometry, these drops have a size of only a few micrometers and fly at up to 40 m/s. Accordingly, this is a true liquid jet as is known from ink printing technology as a continuous jet or high-pressure system.

After the rapid disintegration of the initial high-pressure jet, the individual targets 21 fly through a ring electrode 36 which charges them electrically. The charged targets 27 then traverse a deflecting unit 37 in which the individual targets 21 that are not needed are deflected in the electrical field as in an oscillograph. Controlled by a trigger unit (not shown) for the defined generation of the laser beam 52 synchronous to the individual targets 21 entering the interaction point 61, the electrical field between the electrodes of the deflecting unit 37 deflects a defined quantity of excess targets. The deflected targets 29 do not then fly through the outlet opening 43 of the selection chamber 41, but rather are intercepted at the wall of the selection chamber 41 in which the outlet opening 43 to the interaction chamber 4 is located. The target material is then vaporized or sublimated at this wall of the selection chamber 41, which thus serves as a simple catching device, and can be pumped out by means of the pump 42 and processed again.

In all of the examples described above, an additional amount of target material that is vaporized or sublimated due to the finite vapor pressure on the target path 22 from the inlet opening into the interaction chamber 4 to the interaction point 61 must be introduced for radiation generation in addition to the amount of target material that interacts directly with the energy beam 5 in order to generate a desired characteristic radiation in the plasma 6. This process of vaporization or sublimation is reinforced by the radiation from the plasma 6 that is absorbed by the target material.

Therefore, the effective loss of mass must either be compensated by a corresponding increase in the initial size of the individual targets 21 or—as is shown in FIG. 4—can be kept very small by means of one or more sacrifice targets 25 which serve as a vaporization shield 26. The solution to the vaporization problem according to FIG. 4 can accordingly be combined with all other embodiment forms of the invention.

Further, as was mentioned with reference to FIG. 4, target columns 24 with more than one main target 27 can also be realized when a laser beam 52 is used as energy beam 5. Since it is known that the focus dimensions of the laser beam 52 cannot be adjusted to be infinitely small, but the smallest possible target diameter (with respect to the excitation depth) should be achieved for the sake of converting the individual targets 21 into radiating plasma 6 as completely as possible, it is useful to allow a plurality of main targets 27 to follow behind the radiation shield 26 of the sacrifice target 25 insofar as these main targets 27 can be excited simultaneously by a laser pulse (within the laser focus). In this connection, a plurality of target paths 22 located next to one another is also useful.

While the foregoing description and drawings represent the present invention, it will be obvious to those skilled in the art that various changes may be made therein without departing from the true spirit and scope of the present invention.

REFERENCE NUMBERS

1 target generator
2 target flow
21 individual target
22 target path
23 target sequence
24 column
25 sacrifice target
26 vaporization shield
27 main target
28 charged target
29 deflected target
3 target selector
31 (first) chopper wheel
311 axis
312 (separate) axis
313 solid shaft
314 hollow shaft
32 second chopper wheel
33 aperture
34 hollow cylinder
35 cylinder axis
36 ring electrode
37 deflecting electrode
4 interaction chamber
41 selection chamber
6 plasma
61 interaction point

The invention claimed is:

1. An arrangement for providing target material for the generation of short-wavelength electromagnetic radiation, in particular EUV radiation, comprising:

a target generator for generating a regular succession of individual targets being arranged so as to open into an interaction chamber, wherein the generated target sequence advances along a target path;

an energy beam for generating a plasma emitting the desired radiation being directed to an interaction point on the target path;

said interaction chamber being preceded by a selection chamber into which the target generator opens and which has, along the target path, an outlet opening into the interaction chamber; and a target selector being arranged in the selection chamber, which target selector includes means for eliminating a quantity of individual targets from the regular target sequence of the target generator, so that only the individual targets necessary for efficient plasma generation corresponding to a given pulse frequency of the energy beam are admitted to the interaction point in the interaction chamber.

2. The arrangement according to claim 1, wherein the target selector has a rotating chopper wheel in which the quantity of admitted individual targets and eliminated individual targets can be adjusted by means of a duty cycle ratio of apertures to closed areas of the chopper wheel which periodically cross the target path.

3. The arrangement according to claim 1, wherein the target selector comprises at least two chopper wheels that are arranged one after the other along the target path, wherein the quantity of individual targets that are admitted and eliminated is adjusted by duty cycle ratios of apertures to closed areas of the individual chopper wheels and by a phase position of the apertures of the chopper wheels with respect to one another.

4. The arrangement according to claim 3, wherein the chopper wheels are arranged on a common axis with fixed phase position.

5. The arrangement according to claim 3, wherein the chopper wheels are arranged on separate axes, wherein the phase position and spacing of the chopper wheels can be adjusted in a variable manner.

6. The arrangement according to claim 3, wherein the chopper wheels are arranged coaxially on a solid shaft and at least one hollow shaft, wherein the phase position and spacing of the chopper wheels can be adjusted in a variable manner.

7. The arrangement according to claim 3, wherein the first chopper wheel has a duty cycle ratio of apertures to closed areas such that a column of a plurality of individual targets from the target sequence provided by the target generator is admitted to the second chopper wheel.

8. The arrangement according to claim 7, wherein the spacing of the chopper wheels along the target path is adjusted in such a way that only one individual target from the target column entering through the first chopper wheel is admitted through the second chopper wheel.

9. The arrangement according to claim 7, wherein the spacing of the chopper wheels along the target path is adjusted in such a way that at least two successive individual targets from the target column entering through the first chopper wheel are admitted through the second chopper wheel, wherein at least a first target is a sacrifice target for forming a vaporization shield for at least one subsequent main target.

10. The arrangement according to claim 1, wherein the target selector has an open hollow cylinder which is arranged so as to be rotatable around a cylinder axis disposed orthogonal to the target path such that it is pierced by the target path at two points, and the quantity of admitted individual targets and eliminated individual targets can be adjusted by a duty cycle ratio of apertures to closed areas of the hollow cylinder and by the spacing of the cylinder axis relative to the target path.

11. The arrangement according to claim 10, wherein the hollow cylinder has a duty cycle ratio of apertures to closed areas such that a column comprising a plurality of individual targets from the target sequence provided by the target generator is allowed to enter the hollow cylinder.

12. The arrangement according to claim 10, wherein the spacing of the cylinder axis of the hollow cylinder relative to the target path can be adjusted in such a way that only one individual target from the target column entering the hollow cylinder is allowed to exit from the hollow cylinder.

13. The arrangement according to claim 10, wherein the distance of the cylinder axis of the hollow cylinder from the target path is adjusted in such a way that at least two successive individual targets from the target column entering the hollow cylinder exit from the hollow cylinder, wherein at least a first target is a sacrifice target for forming a vaporization shield for at least one subsequent main target.

14. The arrangement according to claim 1, wherein the target selector has a deflecting unit based on a force field for deflecting a quantity of individual targets from their normal target path, wherein the force field is switchable in a pulsed manner so that only a determined number of individual targets generated by the target generator arrive in the interaction chamber through the outlet opening of the selection chamber and the wall next to the outlet opening of the selection chamber is provided for intercepting the rest of the targets.

15. The arrangement according to claim 14, wherein the deflecting unit is arranged in such a way that the deflected targets are caught in the selection chamber at a wall next to the outlet opening.

16. The arrangement according to claim 14, wherein the deflecting unit is arranged in such a way that only the deflected targets reach the interaction point in the interaction chamber through the outlet opening of the selection chamber.

17. The arrangement according to claim 14, wherein the target selector has a ring electrode and a deflecting unit based on an electric field.

18. The arrangement according to claim 14, wherein the target selector has a ring electrode and a deflecting unit based on a magnetic field.

19. The arrangement according to claim 1, wherein the selection chamber has a pump for differential pumping out of target material that is eliminated by the target selector.

20. The arrangement according to claim 1, wherein the selection chamber has a heatable surface for faster vaporization of target materials with a lower vapor pressure under process conditions.

21. The arrangement according to claim 20, wherein the heatable surface is a chopper wheel of the target selector.

22. The arrangement according to claim 20, wherein the heatable surface is a wall in the rotating direction of the chopper wheel.

23. The arrangement according to claim 1, wherein the target selector is adjusted in such a way that it passes exactly one individual target into the interaction chamber from the target sequence provided by the target generator in order to bring this individual target into interaction with the energy beam.

24. The arrangement according to claim 1, wherein the target selector is adjusted in such a way that it passes at least two successive individual targets of the target sequence provided by the target generator, wherein at least a first target of a target column of this kind is a sacrifice target for forming a vaporization shield for at least one subsequent main target.

* * * * *